(12) United States Patent
Wu et al.

(10) Patent No.: US 8,336,020 B2
(45) Date of Patent: Dec. 18, 2012

(54) COMPUTING DEVICE AND METHOD FOR INSPECTING LAYOUT OF PRINTED CIRCUIT BOARD

(75) Inventors: Dan-Chen Wu, New Taipei (TW);
Shou-Kuo Hsu, New Taipei (TW);
Cheng-Hsien Lee, New Taipei (TW);
Chun-Jen Chen, New Taipei (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/213,072

(22) Filed: Aug. 18, 2011

(65) Prior Publication Data
US 2012/0297356 A1 Nov. 22, 2012

(30) Foreign Application Priority Data

May 18, 2011 (TW) .................................. 100117489

(51) Int. Cl.
*G06F 17/50* (2006.01)
(52) U.S. Cl. ............ 716/137; 716/52; 716/54; 716/106; 716/111
(58) Field of Classification Search .................... 716/52, 716/54, 106, 111, 137
See application file for complete search history.

(56) References Cited

U.S. PATENT DOCUMENTS

| | | | | |
|---|---|---|---|---|
| 6,725,434 B2 * | 4/2004 | Murayama | ..................... | 716/112 |
| 6,829,754 B1 * | 12/2004 | Yu et al. | ........................ | 716/106 |
| 7,472,367 B1 * | 12/2008 | Xie et al. | ....................... | 716/132 |
| 7,747,975 B2 * | 6/2010 | Dinter et al. | ................... | 716/119 |
| 7,761,276 B1 * | 7/2010 | Degerstrom et al. | ........... | 703/14 |
| 2004/0162715 A1 * | 8/2004 | Frank et al. | ....................... | 703/14 |
| 2007/0200586 A1 * | 8/2007 | Phoon et al. | .................. | 324/765 |
| 2008/0077903 A1 * | 3/2008 | Dinter et al. | .................... | 716/11 |
| 2008/0318450 A1 * | 12/2008 | Regnier et al. | .................. | 439/78 |
| 2011/0106481 A1 * | 5/2011 | Liang et al. | .................... | 702/117 |
| 2011/0321000 A1 * | 12/2011 | Fujimori | ....................... | 716/136 |

OTHER PUBLICATIONS

"Allegro Constraint Manager User Guide", by Cadence, @ Dec. 2009.*
"System Connectivity Manager User Guide", by Cadence @ Dec. 2009.*

* cited by examiner

*Primary Examiner* — Nha Nguyen
(74) *Attorney, Agent, or Firm* — Altis Law Group, Inc.

(57) ABSTRACT

In a method for inspecting the layout of a printed circuit board (PCB), a component to be checked is determined from an electronic layout diagram of the PCB, and a power transmission line which may be serving that component is selected. The layout diagram is checked to determine whether the component is connected to the power transmission line, and further checked to determine whether more than one ground pins of the component is connected to the power transmission line. Vias that are shared by two or more ground pins of the component are determined if more than one ground pin is connected to the power transmission line. Shared vias are marked on the layout diagram.

9 Claims, 4 Drawing Sheets

COMPUTING DEVICE AND METHOD FOR INSPECTING LAYOUT OF PRINTED CIRCUIT BOARD

BACKGROUND

1. Technical Field

Embodiments of the present disclosure relate generally to circuit inspection of printed circuit boards (PCBs), and particularly to a computing device and a method for inspecting layout of a PCB.

2. Description of Related Art

PCBs provide a means of implementing a circuit design (e.g., the interconnection of electrical devices and components) for use, for example, in a computer system. In PCB design, both component placement (layout) and signal path routing need to be considered, so a layout inspection of the PCB is very important. During inspection of the PCB, it is necessary to check whether each ground pin of the PCB is connected to its own via. If more than one ground pin of a component of the PCB share one via, there may be ground bounce, and the power supply of the PCB may be unstable. Currently, a manual method for inspecting the ground pins of the PCB is applied, which is time consuming and has a low efficiency.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
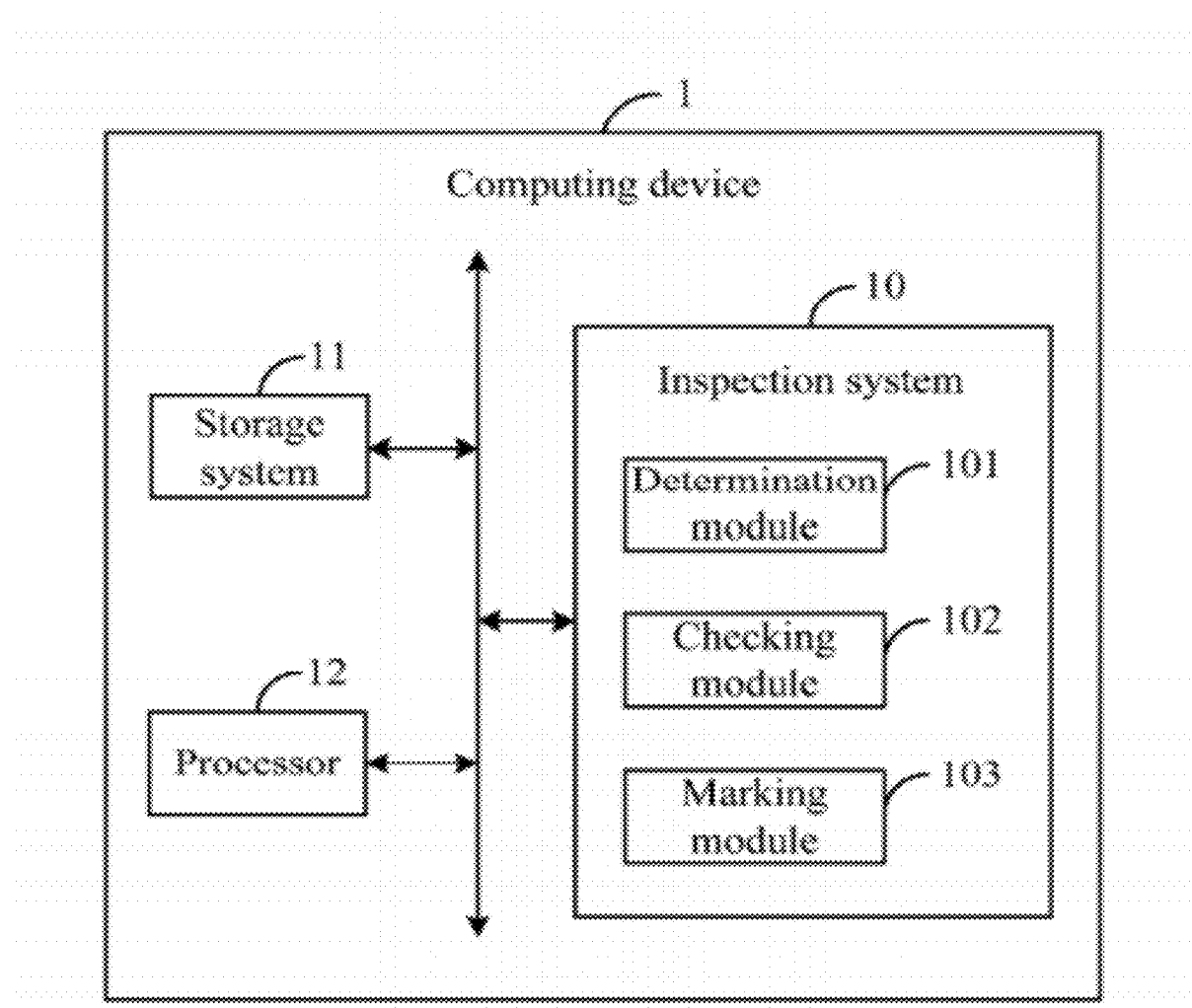
FIG. 1 is a block diagram of one embodiment of a computing device including an inspection system.

FIG. 1 is a block diagram of one embodiment of a computing device 1 including an inspection system 10. In the embodiment, the device 1 further includes a storage system 11, and a processor 12. The inspection system 10 can inspect components of an electronic layout diagram of a printed circuit board (PCB), to check whether vias on the PCB are shared by two or more ground pins of a component connected to a power transmission line of the PCB. If two or more ground pins of the component share one via, the inspection system 10 may mark the shared via on the layout diagram, so that the layout of the PCB can be corrected according to the marking. FIG. 1 is only one example of the device 1 and the device 1 can include more or fewer components than those shown in the embodiment, or a different configuration of the various components.

The inspection system 10 may include a plurality of software programs in the form of one or more computerized instructions stored in the storage system 11, and executed by the processor 12 to perform the operations of the device 1. In the embodiment, the inspection system 10 includes a determination module 101, a checking module 102, and a marking module 103. In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

The determination module 101 is operable to determine a component to be checked, from the layout diagram of the PCB. In one embodiment, the determination module 101 may determine the component according to user selection. For example, the determination module 101 may receive one or more keywords of the component input by a user using an input device, and search the components of the PCB for inclusion in the keywords. Then, the determination module 101 determines the component to be checked according to a user selection from the searched components (or alternatively, all components can be checked automatically).

Figure 3:
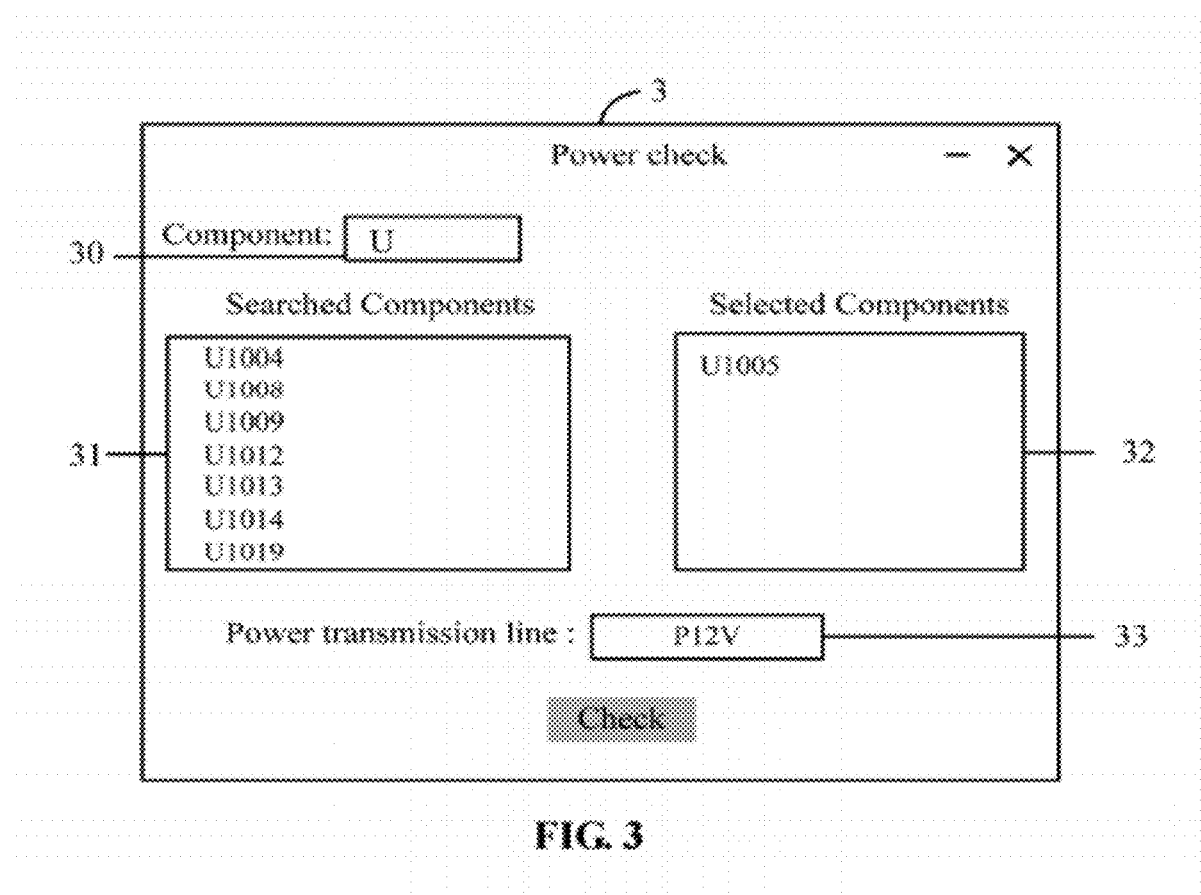
FIG. 3 is schematic diagram illustrating one example of a user interface of the inspection system of FIG. 1.

In one example, as shown in FIG. 3, the determination module 101 may determine the component to be checked according to user operations on a user interface 3 of the inspection system 10. For example, the user may input a keyword "U" through a first input box 31 of the user interface 3. The determination module 101 searches through the components of the PCB for the keyword "U". The searched-out components 31 may be displayed on the user interface 3. Then, the user may select one particular component from the searched-out components 31 displayed on the user interface 3. The component selected is to be checked.

The determination module 101 is further operable to select a power transmission line of the PCB from the layout diagram. The power transmission line may be selected according to a user input or it may be selected automatically by the determination module 101. In one example with respect to FIG. 3, the user may input a name, such as P12V, of a power transmission line through a second input box 33 of the user interface 3. Thus, a power transmission line that provides a voltage of 12V is selected by the determination module 101.

The checking module 102 is operable to check the layout diagram to determine whether the determined component is connected to the power transmission line. In the embodiment, if at least one pin of the component is connected to the power transmission line, the component is determined to be connected to the power transmission line.

In response to the component being determined to be connected to the power transmission line, the checking module 102 is further operable to check the layout diagram to determine whether more than one ground pin of the component is connected to the power transmission line, and further determine whether there are vias of the PCB which are shared by two or more ground pins of the component if more than one ground pin of the component is connected to the power transmission line. In the embodiment, if one of the vias is connected to at least two ground pins of the component, the via is determined to be shared. In addition, each via of the PCB has coordinates in the layout diagram. The shared vias are determined according to the coordinates of each via connected to the ground pins. In one example, if two or more vias connected to the ground pins have one or the same coordinate(s), the two or more vias are determined to be actually one shared via.

The marking module 103 is operable to mark the shared vias on the layout diagram, if any shared vias are found. The marking module 103 may mark each of the shared vias using a rectangle or a circle centered on each via.

Figure 4:
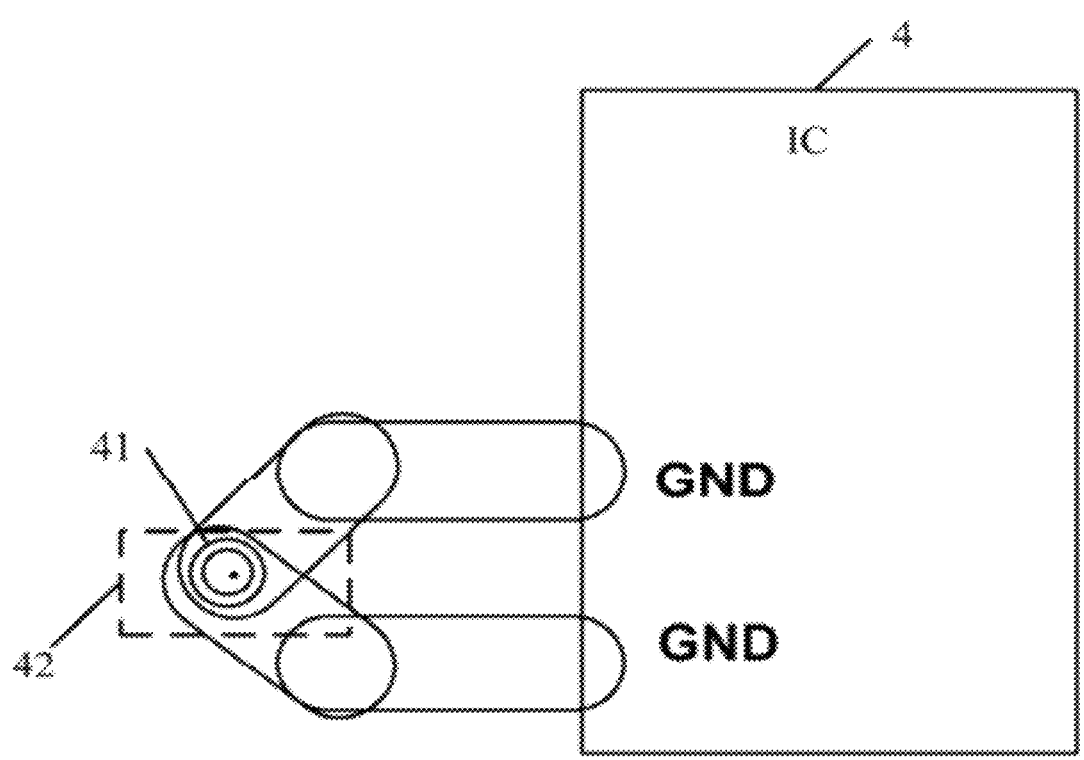
FIG. 4 is a schematic diagram illustrating one example of an integrated circuit chip (IC) of the PCB.

In one example, as shown in FIG. 4, a via 41 is shared by two ground pins of a integrated circuit chip (IC) 4, the via 41 is marked by a rectangle 42 centered on the via 41. Thus, a designer may correct the layout of the PCB according to the via marking, to avoid ground bounce, and to ensure a stable power supply to the PCB.

Figure 2:
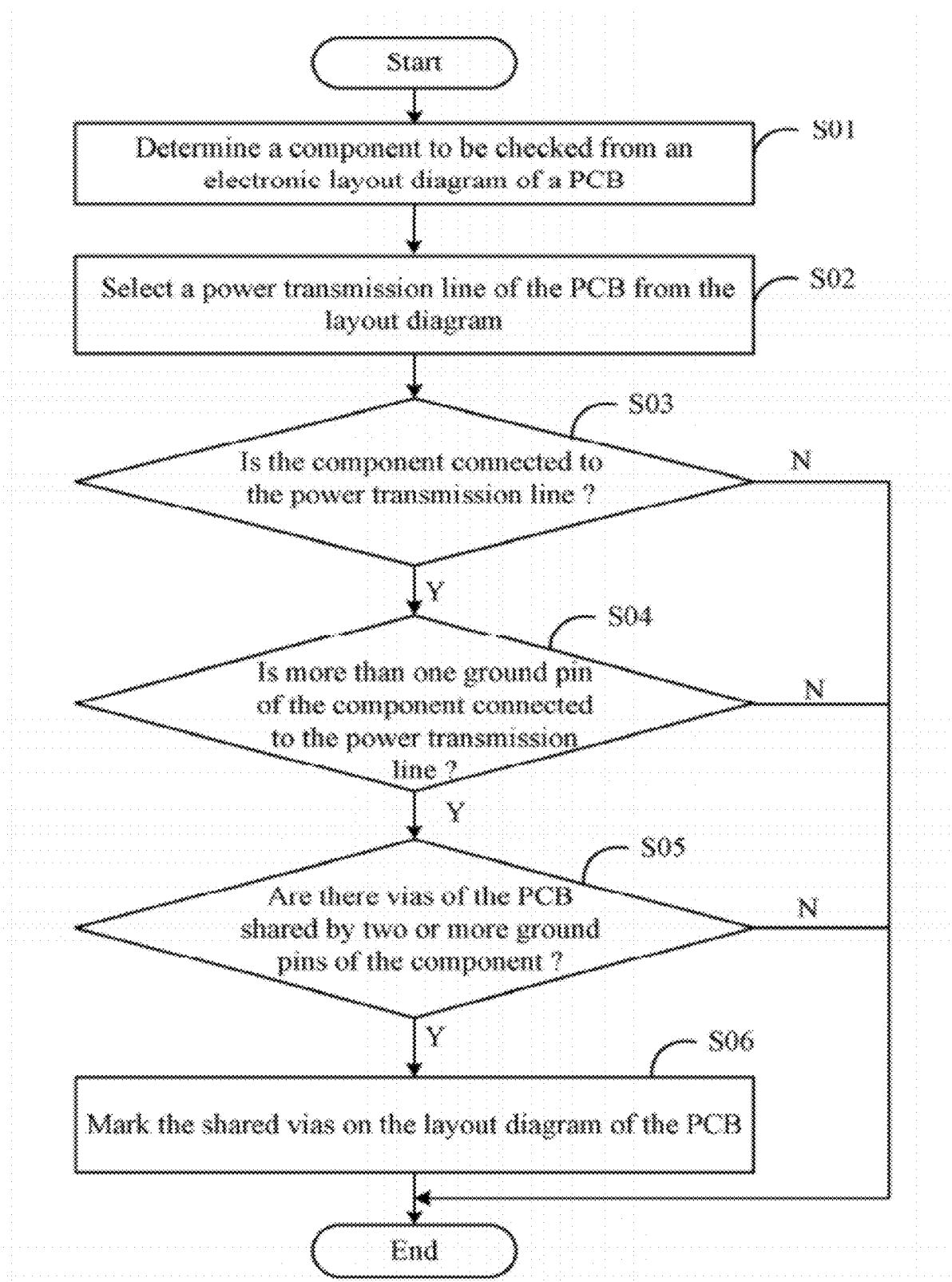
FIG. 2 is a flowchart of one embodiment of a method for inspecting layout of a printed circuit board (PCB) using the system of FIG. 1.

FIG. 2 is a flowchart of one embodiment of a method for inspecting the layout of a PCB using the inspection system 10 of FIG. 1. Depending on the embodiment, additional blocks may be added, others removed, and the ordering of the blocks may be changed.

In block S01, the determination module 101 determines a component to be checked from the layout diagram of the PCB. In one embodiment, the determination module 101 may determine the component according to a user input, as detailed above.

In block S02, the determination module 101 selects a power transmission line of the PCB from the layout diagram. The power transmission line may be selected by a user. In one example (with respect to FIG. 3), the user may input a name, such as P12V, of a power transmission line, through the second input box 33 of the user interface 3. Thus, a power transmission line that provides a voltage of 12V may be selected by the determination module 101.

In block S03, the checking module 102 checks the layout diagram to determine whether the determined or selected component is connected to the power transmission line. If the component is in fact connected to the power transmission line, block S04 is implemented. If the component is not connected to the power transmission line, the procedure is ended. In the embodiment, if one or more pins of the component are connected to the power transmission line, the component is determined to be connected to the power transmission line.

In block S04, the checking module 102 checks the layout diagram to determine whether more than one ground pin of the component is designed for connection to the power transmission line. If more that one ground pin of the component is connected to the power transmission line, block S05 is implemented. If only one or no ground pin of the component is intended for connection to the power transmission line, the procedure is ended.

In block S05, the checking module 102 determines whether there are vias of the PCB which are shared by two or more ground pins of the component. If there are vias of the PCB that are shared by two or more ground pins of the component, block S06 is implemented. If no via is shared in this way, the procedure is ended. If one of the vias is connected to at least two ground pins of the component, the via is determined to be a shared via.

In block S06, the marking module 103 marks the shared vias on the layout diagram of the PCB. The marking module 103 may mark each of the shared vias using a rectangle or a circle centered on each via, so that the layout of the PCB may be correctable according to the markings on the layout diagram.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A computerized method for inspecting layout of a printed circuit board (PCB) using a computing device, the method comprising:

determining, by using the computing device, a component to be checked from an electronic layout diagram of the PCB;

selecting a power transmission line of the PCB from the electronic layout diagram;

determining whether the component is connected to the power transmission line on the electronic layout diagram;

determining whether more than one ground pin of the component is connected to the power transmission line on the electronic layout diagram, when the component is determined to be connected to the power transmission line;

determining vias of the PCB that are shared by two or more ground pins of the component on the electronic layout diagram, when more than one ground pin of the component is connected to the power transmission line;

marking the shared vias on the electronic layout diagram of the PCB; and wherein the component is determined by:

receiving one or more keywords of the component input from a user interface of the computing device;

searching components of the PCB for inclusion in the keywords from the electronic layout diagram; and determining the component to be checked according to user selection from the searched components.

2. The method according to claim 1, wherein each of the shared vias is connected to at least two ground pins of the component.

3. The method according to claim 1, wherein each of the shared vias is marked using a rectangle or a circle centered on each via.

4. A computing device, comprising:

at least one processor;

a storage system; and one or more programs stored in the storage system and being executable by the at least one processor, the one or more programs comprising:

a determination module operable to determine a component to be checked from an electronic layout diagram of a printed circuit board (PCB), and to select a power transmission line of the PCB from the electronic layout diagram;

a checking module operable to determine whether the component is connected to the power transmission line on the electronic layout diagram, determine whether more than one ground pin of the component is connected to the power transmission line when the component is determined to be connected to the power transmission line, and further determine vias of the PCB that are shared by two or more ground pins of the component on the electronic layout diagram when more than one ground pin of the component is connected to the power transmission line;

a marking module operable to mark the shared vias on the electronic layout diagram of the PCB; and wherein the component is determined by:

receiving one or more keywords of the component input from a user interface of the computing device;

searching components of the PCB for inclusion in the keywords from the electronic layout diagram; and determining the component to be checked according to user selection from the searched components.

5. The computing device according to claim 4, wherein each of the shared vias is connected to at least two ground pins of the component.

6. The computing device according to claim 4, wherein each of the shared vias is marked using a rectangle or a circle centered on each via.

7. A non-transitory storage medium storing a set of instructions, the set of instructions capable of being executed by a processor of a computing device, cause the computing device to perform a method for inspecting layout of a printed circuit board (PCB), the method comprising:
   determining a component to be checked from an electronic layout diagram of the PCB;
   selecting a power transmission line of the PCB from the electronic layout diagram;
   determining whether the component is connected to the power transmission line on the electronic layout diagram;
   determining whether more than one ground pin of the component is connected to the power transmission line on the electronic layout diagram, when the component is determined to be connected to the power transmission line;
   determining vias of the PCB that are shared by two or more ground pins of the component on the electronic layout diagram, when more than one ground pin of the component is connected to the power transmission line;
   marking the shared vias on the electronic layout diagram of the PCB; and
   wherein the component is determined by:
   receiving one or more keywords of a component input from a user interface of the computing device;
   searching components of the PCB for inclusion in the keywords from the electronic layout diagram; and
   determining the component to be checked according to user selection from the searched components.

8. The non-transitory storage medium according to claim 7, wherein each of the shared vias is connected to at least two ground pins of the component.

9. The non-transitory storage medium according to claim 7, wherein each of the shared vias is marked using a rectangle or a circle centered on each via.

* * * * *